United States Patent
Zhang

(10) Patent No.: US 6,198,656 B1
(45) Date of Patent: Mar. 6, 2001

(54) ASYMMETRIC MEMORY CELL FOR SINGLE-ENDED SENSING

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,688

(22) Filed: Dec. 23, 1999

(51) Int. Cl.[7] .................................................. G11C 11/00
(52) U.S. Cl. ...................................... 365/154; 365/230.06
(58) Field of Search ................................ 365/230.06, 154

(56) References Cited

U.S. PATENT DOCUMENTS 5,590,087 * 12/1996 Chung et al. .................... 365/230.05

* cited by examiner

Primary Examiner—David Nelms
Assistant Examiner—M. Tran
(74) Attorney, Agent, or Firm—Blakely, Sokoloff, Taylor & Zafman LLP

(57) ABSTRACT

In one embodiment, an apparatus including an asymmetrical memory cell having a first inverter and a second inverter is provided. The first inverter is larger than said second inverter.

10 Claims, 4 Drawing Sheets

ASYMMETRIC MEMORY CELL FOR SINGLE-ENDED SENSING

FIELD OF INVENTION

This invention relates to single ending sensing of memory cells.

BACKGROUND OF THE INVENTION

A prior art differential voltage sensing memory is shown in FIG. 1. Memory 100 includes memory cells 101, 102..., 10n. The memory cells are connected to precharging circuit 110, write circuit 120, and sense amplifier circuit 130 through bit lines 141 and 142. Bit line 142 provides a signal that is the complement of the signal on bit line 141. Each memory cell has pass gates 15n and 16n, which are connected to word lines 17n. When the word line for a given cell, such as cell 101 for example, is high, a differential voltage is generated on bit lines 141 and 142. The sense amplifier circuit 130 reads the data stored in the cell 10n by detecting the differential voltage, and provides an output indicating the value of the data stored in the memory cell 101.

Thus, sense amplifier 130 needs two bit lines 141, 142 to generate a differential voltage in order to read data from a given cell 10n. The overhead from the sensing circuit in the conventional symmetrical memory is rather large, which prevents the use of this memory in high performance devices that cannot devote this large amount of space to the sensing circuitry required for detecting a differential voltage. Therefore the prior art memory cannot provide microprocessors with a large on-chip cache memory having both high speed and reduced area.

Another disadvantage of the prior art memory cells is that the memory cell circuit has to be symmetrical, which requires identical transistors and bit lines on both sides of the memory cell and related sensing circuitry. Therefore, the transistors in the left and right side of the prior art memory cell have to match within very narrow error margins. As the technology scaling continues to decrease, the mismatch in symmetry of the transistors of the memory cell become worse due to manufacturing process variations. It becomes more difficult for the manufacturing processes to decrease the size of the transistors and maintain transistor symmetry within acceptable error margins. Therefore, it is extremely difficult to maintain both cell stability and high sensing speed in the conventional small signal, differential voltage memory circuits.

SUMMARY OF THE INVENTION

In one embodiment, an apparatus including an asymmetrical memory cell having a first inverter and a second inverter is provided. The first inverter is larger than said second inverter.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
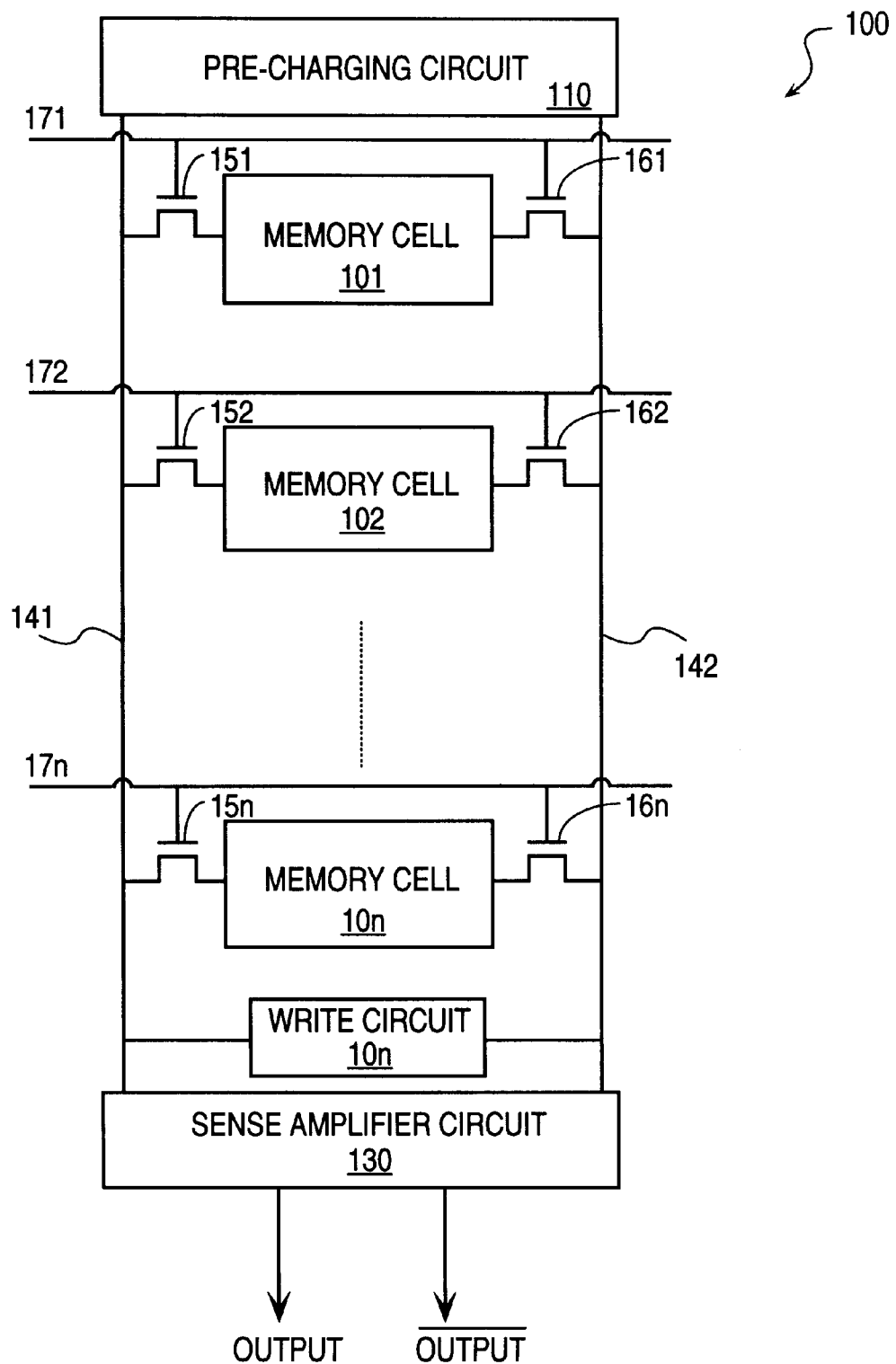
FIG. 1 is a differential voltage sensing circuit used in a memory.
Figure 2:
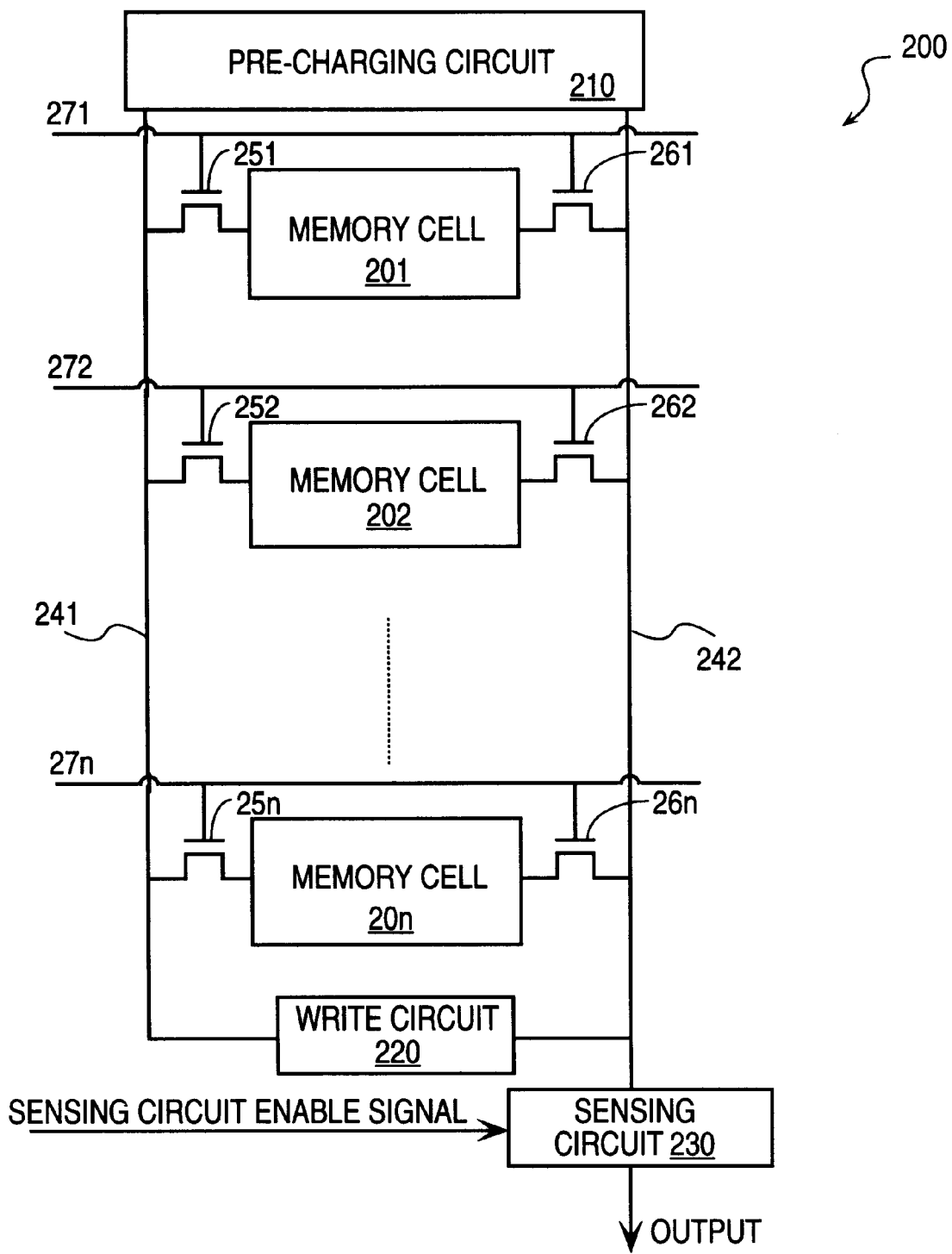
FIG. 2 is a single ended sensing circuit used in a memory.

FIG. 2 shows a single ended sensing circuit used in memory 200, such as a Static Random Access Memory (SRAM), for example, that has only one read bit line 242. When data from one of the memory cells 201 through 20n needs to be read, precharging circuit 210 precharges bit lines 241, 242 to Vcc. A given memory cell 20n is read by sending the memory address of the memory cell 20n to a decoder, which then drives the corresponding word line 27n for cell 20n to high. The pass gate transistors 25n, 26n connected to word line 27n are then turned on. Bit line 242 is connected to an internal node of memory cell 20n where the data is stored through pass gate transistor 26n. Another internal node of the cell 20n is connected to voltage Vcc provided by precharging circuit 210 through line 241 and pass gate transistor 25n.

If the memory cell 20n stores a low voltage value, then the cell draws current through internal pull down paths, and the voltage level on bit line 242 becomes low during a sampling period. If cell 20n stores a high voltage value, then bit line 242 remains high during a sampling period.

A sensing circuit enable signal is asserted after the sampling period so that sensing circuit 230 can read the value stored in cell 20n by detecting the voltage level of bit line 242. The output of sensing circuit 230 is a signal representing the value of the data stored in cell 20n.

Figure 3:
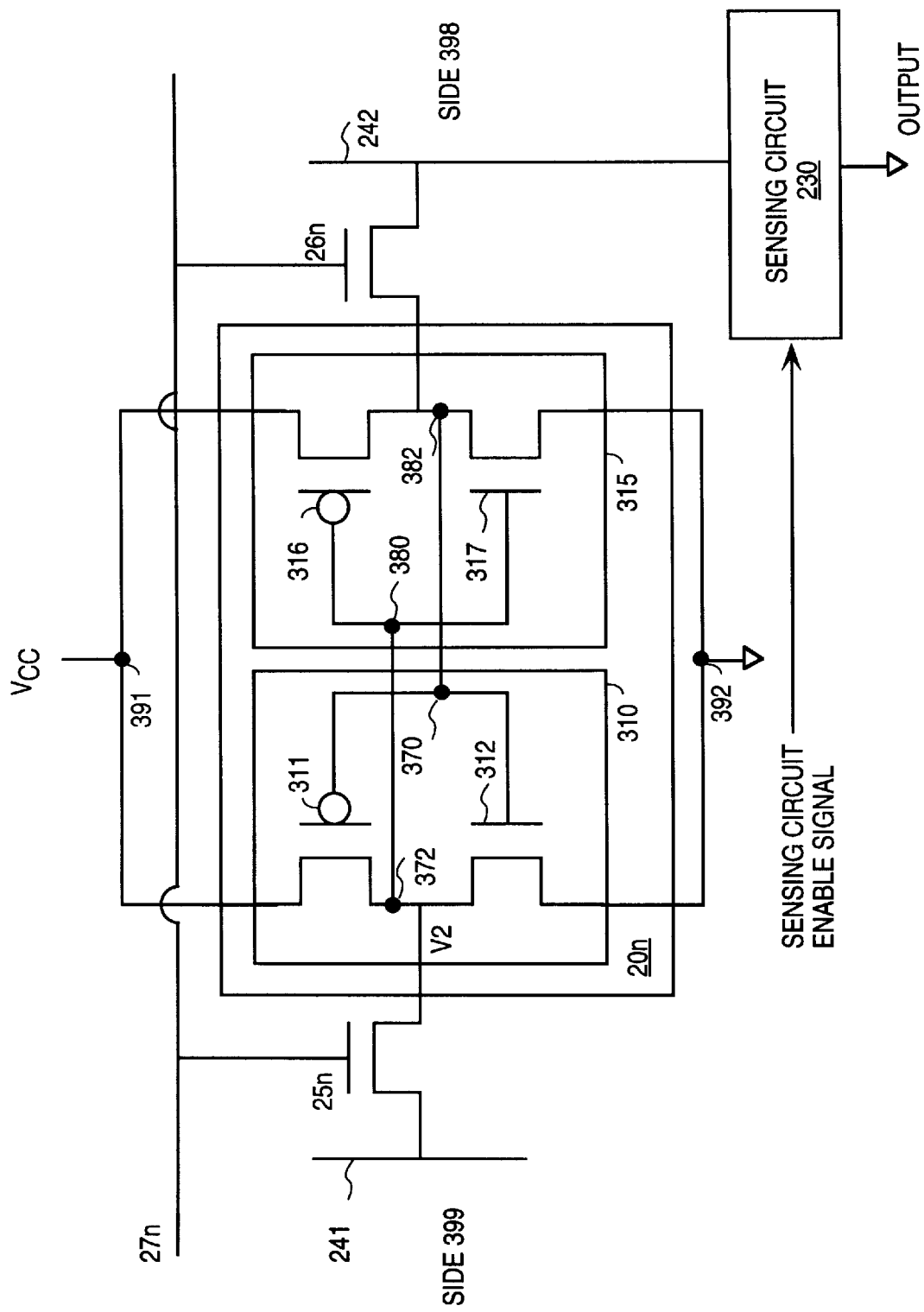
FIG. 3 is an asymmetric memory cell.

An embodiment of the memory cell 20n of FIG. 2 is shown in FIG. 3 and includes two cross-coupled CMOS inverter circuits 310, 315. Inverter circuit 310 includes p-channel transistor 311 and n-channel transistor 312. The drain of transistor 311 is connected to the drain of transistor 312 internally at node 372, and the gates of transistors 311 and 312 are connected together at node 370. Likewise, inverter circuit 315 includes p-channel transistor 316 and n-channel transistor 317. The drain of transistor 316 is connected to the drain of transistor 317 internally at node 382, and the gates of transistors 316, 317 are connected together at node 380. The cross-coupling of inverter circuits 310, 315 is accomplished by connecting node 372 to node 380, and by connecting node 382 to node 370. Together, inverter circuits 310, 315 form a bistable output circuit for memory cell 30n. Transistors 25n and 312 act as a pull-down path for bit line 241. Transistors 26n and 317 act as a pull-down path for bit line 242.

As shown in the drawing, the sources of transistors 311, 316 are connected to $V_{cc}$ at node 391. The source of transistors 312, 317 are connected to ground at node 392. The cell 20n may be read by taking an output from node 382 (the output of inverter circuit 315), and by taking an output from node 372 (the output of inverter 310). Node 382 is connected to the line 242 through pass gate transistor 26n, which has its gate connected to word line 27n. Node 372 is connected to line 241 through pass gate transistor 25n, which also has its gate connected to the word line 27n.

The cell 20n can be read by sensing circuit 230 as discussed above. The sensing circuit can be an asymmetric sense amplifier circuit. Alternatively, the sensing circuit 230 can be an inverter, in order to reduce the area overhead from the sensing circuit. The inverter can be a static inverter or a dynamic inverter circuit. The output of sensing circuit 230 is a signal representing the data stored in the cell 20n.

An advantage of the single-ended sensing circuit used in memory 200 is providing a higher sensing speed than the prior art differential voltage memory circuits. The single ended memory employs large signal sensing, which eliminates the small signal scaling problem in the prior art differential sensing circuit. The single ended sensing circuit is also capable of providing high speed read access through pre-charged domino circuits, such as a dynamic inverter circuit for example.

In order to further increase the advantages of single ended sensing, the memory cells 20n shown in FIG. 2 and 3 are asymmetric memory cells. The asymmetric cells 20n, when used with a single ended sensing circuit, decrease the read access time, provide better cell stability, and reduced the area of the memory compared to the prior art memory with differential voltage sensing circuitry.

The pull down path of the inverter 310 of memory cell 20n is through pass gate transistor 25n and pull down NFET 312. The pull down path of inverter 315 is through pass gate 26n and pull down NFET 317. The strength of these paths determines the speed of the read access to cell 20n. In the prior art differential sensing circuit, the pull down paths on both sides of the cell need to be identical in order to realize differential sensing. However, with single-ended sensing, the read access to cell 20n is conducted from only one side of cell 20n. Therefore, the cell no longer needs to have equal pull down strengths on both sides.

To decrease the read access time, both pull-down and pass gate transistors 317 and 26n on the read side 398 are stronger than the pull down transistor 312 and pass gate transistor 25n on side 399 of cell 20n. Also, the transistor sizes on side 399 may be reduced to reduce the overall size of the cell. The sizes of the transistors in cell 20n are selected so that the cell stability is increased. In the asymmetric cell 20n, the read disturbance is significantly larger on the read inverter 315, because the signal from pass gate transistor 26n is stronger than the signal from transistor 25n connected to inverter 310.

Figure 4:
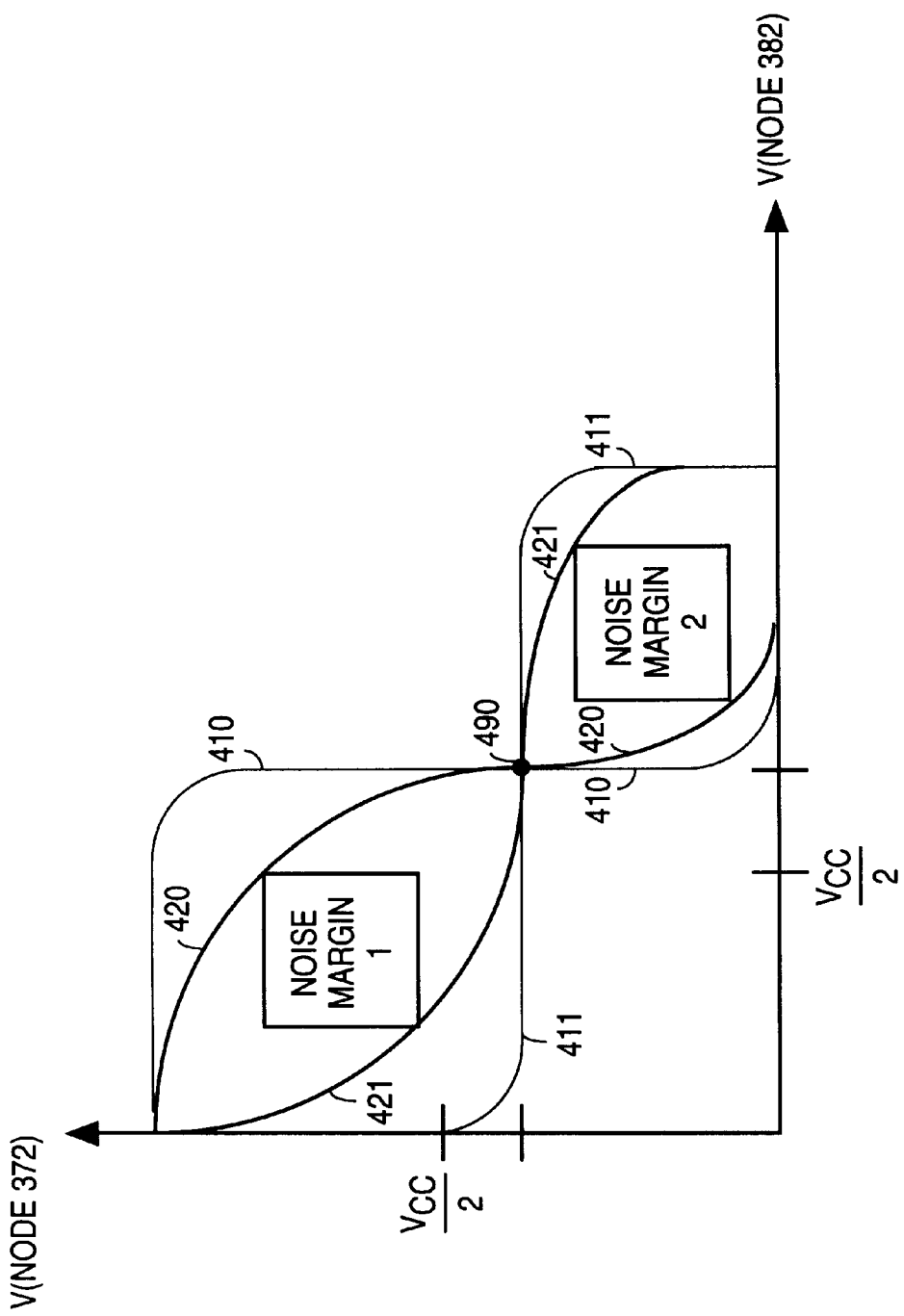
FIG. 4 is a graph of the transfer curves for an asymmetric memory cell of FIG. 3.

As shown in FIG. 4, the curves 410 and 420 are the transfer curves for inverter 310. The curves 411 and 421 are the transfer curves for inverter 315. Data is stored in nodes 372 and 382 of memory cell 20n. The noise margin for node 382 when the pass gate transistors are off is proportional to the area in between curves 410 and 411, above switching point 490. When the pass gate transistors 25n and 26n are turned on, the noise margin for node 382 is skewed, as shown by curves 420, 421 above switching point 490. The acceptable noise margin for inverter 315 during a read operation is shown by noise margin 1.

The noise margin for node 372 when the pass gate transistors are off is shown by curves 410 and 411 below switching point 490. When transistors 25n and 26n are turned on, the noise margin for node 372 is skewed, as shown by curves 420, 421 below switching 490. The acceptable noise margin for node 372 during a read operation is shown by noise margin 2.

The amount of disturbance to storage node 382 during a read operation is much greater than the disturbance to node 372, as shown for example by the distance between curves 410, 420, above switching point 490 as compared to the distance between curves 410 and 420 below switching point 490. To compensate for this larger disturbance at node 382, the cell has a much larger noise margin in node 382. The noise margin for node 382 may be increased by optimizing the size of the transistors of inverter 315. In one embodiment, the size of inverter 315 is larger than inverter 310. Therefore, a larger noise margin is allocated to node 382 on the read side. Cell 20n is thus an asymmetric memory cell.

An advantage of increasing the size of the inverter 315 and decreasing the size of inverter 310 is that the read noise margin of the asymmetrical cell 20n is higher than the read noise margin of a conventional symmetrical cell. Furthermore, because the disturbance on the weak side 399 is comparatively small, an acceptable noise margin for node 372 can be maintained without increasing the size of inverter 310. In one embodiment, the size of the transistors for inverter 310 are decreased, so that they are smaller than the transistors of inverter 315.

Memory cell 20n has the performance shown by the transfer curves of FIG. 4 because of the ratio of the P-transistor size to N-transistor size (P/N ratio) in inverters 310 and 315, and the ratio of the pull-down transistors to pass gate transistors for each side 398, 399. In inverter 315, the P/N ratio of P transistor 316 to N transistor 317 is small. For example, if the P/N ratio of an inverter in a symmetrical cell is 1 to 2, this ratio is decreased to 1 to 5, for example, in an asymmetrical cell 20n.

Additionally, both pass gate transistor 26n and pull-down transistor 317 are increased in size, and are therefore stronger than the corresponding transistors on side 399. Thus, the pass-gate transistor 26n and pull-down transistor 317 have a stronger ability to draw current, which results in a faster sensing time by sensing circuit 230, and a faster read time than conventional symmetrical memory cells.

In order to reduce the overall size of memory cell 20n, the size of the transistors on side 399 may be reduced. Furthermore, the P/N ratio for inverter 310 may be increased to improve the noise margin at node 372. For example, if the P/N ratio of transistors 311, 312 in inverter 310 of a conventional memory cell are 1 to 2, this ratio may be increased to 1 to 1 in an asymmetrical cell. Thus, the overall size of inverter 310 is decreased, which provides the advantage of reducing the overall size of memory cell 20n. The size of the pass gate transistor 25n may also be decreased to further reduce the size of memory cell 20n. The reduced size of pass gate transistor 25n results in a weak pass gate transistor, because the transistor 25n has a reduced capability of drawing current.

Thus, in one embodiment, the ratio of the pass-gate transistor to pull-down transistor is larger on side 398 than on side 399. An advantage of this embodiment is that the speed of a read operation increases by over 25% compared to conventional symmetrical memory cells. An additional advantage is that this increased speed occurs in an asymmetrical cell with a cell area that is the same as or less than the cell area of a conventional symmetrical memory cell. The speed of on-chip cache memory is important to the overall performance of a central processing unit (CPU). Single-ended sensing of asymmetric cache memory cells thus improves the performance of a CPU.

These and other embodiments of the present invention may be realized in accordance with the teachings described herein and it should be evident that various modifications and changes may be made in the teachings without departing from the broader spirit and scope of the invention. The specification and drawings are, accordingly, to be regarded in an illustrative rather than restrictive sense and the invention measured only in terms of the claims.

What is claimed is:

1. An apparatus comprising:
   an asymmetrical memory cell having
   a first inverter and a second inverter, said first inverter is larger than said second inverter;
   a first pass gate transistor connected to an output of the first inverter; and
   a second pass gate transistor connected to an output of the second inverter;

wherein the first pass gate transistor is larger than the second pass gate transistor.

2. The apparatus of claim 1 wherein the first inverter further comprises a first pull-down transistor, and the second inverter further comprises a second pull-down transistor, wherein the first pull-down transistor is larger than the second pull-down transistor.

3. The apparatus of claim 2, further comprising a sensing circuit connected to an output of the first pass gate transistor to read data stored in the asymmetrical memory cell.

4. An apparatus comprising:

an asymmetrical memory cell having a first inverter and a second inverter, said first inverter is larger than said second inverter;

a bit line connected to an output of the asymmetrical memory cell;

a sensing circuit having an input connected to the bit line and an output to output a signal representing the data stored in the asymmetrical memory cell;

a first pass gate transistor connected to an output of the first inverter; and a second pass gate transistor connected to an output of the second inverter;

wherein the first pass gate transistor is larger than the second pass gate transistor.

5. The apparatus of claim 4 wherein the first inverter further comprises a first pull-down transistor, and the second inverter further comprises a second pull-down transistor, wherein the first pull-down transistor is larger than the second pull-down transistor.

6. The apparatus of claim 4, wherein the sensing circuit comprises an inverter.

7. An apparatus comprising:

an asymmetrical memory means for storing data, said asymmetrical memory means having a first inverter means for storing a bit and a second inverter means for storing a complementary bit, said first inverter means is larger than said second inverter means;

sensing means for sensing the data stored in the asymmetrical memory cell, said sensing means having an input connected an output of the asymmetrical memory cell and an output to output a signal representing the data stored in the asymmetrical memory cells;

a first pass gate transistor connected to an output of the first inverter means; and a second pass gate transistor connected to an output of the second inverter means;

wherein the first pass gate transistor is larger than the second pass gate transistor.

8. The apparatus of claim wherein the first inverter means further comprises a first pull-down transistor, and the second inverter means further comprises a second pull-down transistor, wherein the first pull-down transistor is larger than the second pull-down transistor.

9. The apparatus of claim 8, wherein the sensing means comprises a sensing circuit connected to an output of the first pass gate transistor to read data stored in the asymmetrical memory cell.

10. The apparatus of claim 9 wherein the sensing circuit comprises an inverter.

* * * * *

UNITED STATES PATENT AND TRADEMARK OFFICE
CERTIFICATE OF CORRECTION

PATENT NO.    : 6,198,656 B1
DATED         : March 6, 2001
INVENTOR(S)   : Kevin X. Zhang It is certified that error appears in the above-identified patent and that said Letters Patent is hereby corrected as shown below:

Column 6,
Line 21, delete "claim wherein" and insert -- claim 7 wherein --.

Signed and Sealed this

Twenty-seventh Day of August, 2002

Attest:

JAMES E. ROGAN
Attesting Officer    Director of the United States Patent and Trademark Office